(12) United States Patent
Baek et al.

(10) Patent No.: US 7,274,097 B2
(45) Date of Patent: Sep. 25, 2007

(54) SEMICONDUCTOR PACKAGE INCLUDING REDISTRIBUTION PATTERN AND METHOD OF MANUFACTURING THE SAME

(75) Inventors: Seung-Duk Baek, Asan (KR); Dong-Hyeon Jang, Suwon (KR); Jong-Joo Lee, Suwon (KR)

(73) Assignee: Samsung Electronics Co., Ltd., Suwon-si, Gyeonngi-do (KR)

( * ) Notice: Subject to any disclaimer, the term of this patent is extended or adjusted under 35 U.S.C. 154(b) by 174 days.

(21) Appl. No.: 11/137,803

(22) Filed: May 26, 2005

(65) Prior Publication Data
US 2005/0269684 A1 Dec. 8, 2005

(30) Foreign Application Priority Data
Jun. 8, 2004 (KR) .................... 10-2004-0041963

(51) Int. Cl.
*H01L 23/02* (2006.01)
*H01L 21/44* (2006.01)

(52) U.S. Cl. ............... 257/686; 257/687; 257/698; 257/700; 438/612; 438/614

(58) Field of Classification Search ............... 257/678, 257/686, 687, 698, 700; 438/106–109, 612–614
See application file for complete search history.

(56) References Cited

U.S. PATENT DOCUMENTS

| | | | |
|---|---|---|---|
| 4,866,507 A | 9/1989 | Jacobs et al. | |
| 5,135,889 A | 8/1992 | Allen | |
| 5,665,650 A | 9/1997 | Lauffer et al. | |
| 5,814,848 A | 9/1998 | Oshima | |
| 6,211,576 B1 | 4/2001 | Shimizu et al. | |
| 6,326,701 B1 | 12/2001 | Shinogi et al. | |
| 6,462,423 B1 | 10/2002 | Akram et al. | |
| 6,501,169 B1 | 12/2002 | Aoki et al. | |
| 6,589,864 B2 | 7/2003 | Yiu et al. | |
| 6,608,377 B2 * | 8/2003 | Chang et al. | ............... 257/700 |
| 6,664,644 B2 | 12/2003 | Morozumi | |
| 2003/0011068 A1 | 1/2003 | Song et al. | |

FOREIGN PATENT DOCUMENTS

KR 1020020063675 A 8/2002

* cited by examiner

*Primary Examiner*—Hsien-Ming Lee
(74) *Attorney, Agent, or Firm*—Volentine & Whitt, PLLC

(57) ABSTRACT

A semiconductor device package includes a substrate, first and second chip pads spaced apart over a surface of the substrate, and an insulating layer located over the surface of the substrate. The insulating layer includes a stepped upper surface defined by at least a lower reference potential line support surface portion, and an upper signal line support surface portion, where a thickness of the insulating layer at the lower reference potential line support surface portion is less than a thickness of the insulating layer at the upper signal line support surface portion. The package further includes a conductive reference potential line electrically connected to the first chip pad and located on the lower reference potential support surface portion of the insulating layer, a conductive signal line electrically connected to the second chip pad and located on the upper signal line support surface portion, and first and second external terminals electrically connected to the conductive reference potential line and the conductive signal line, respectively.

41 Claims, 12 Drawing Sheets

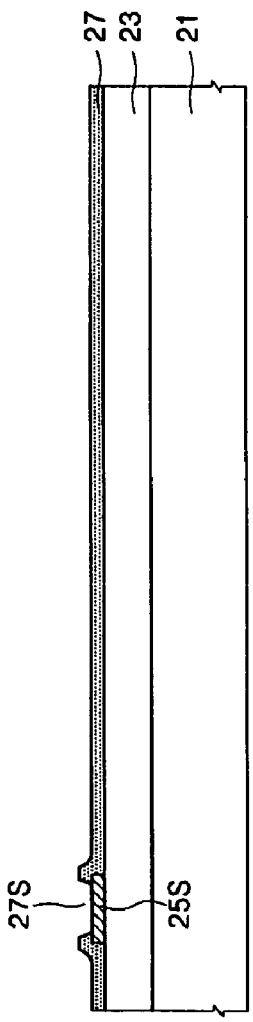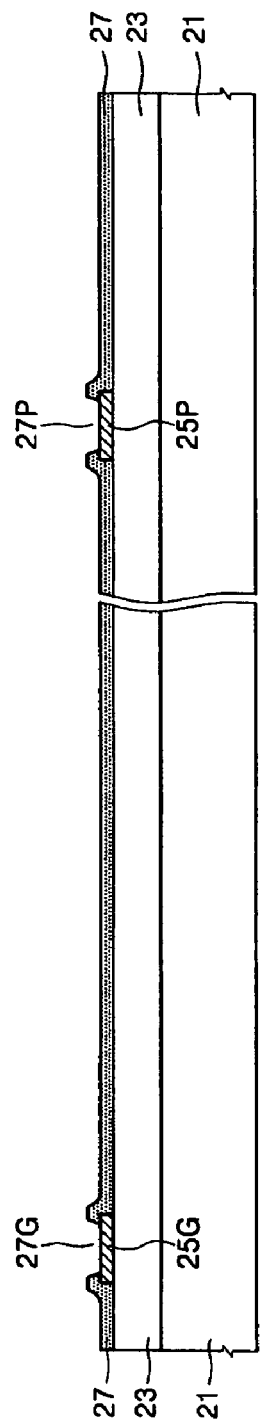

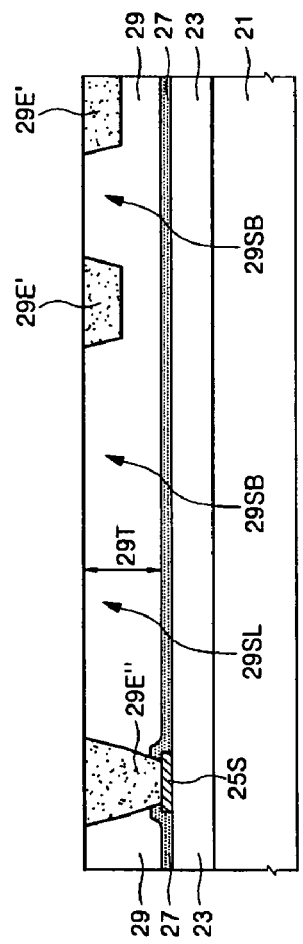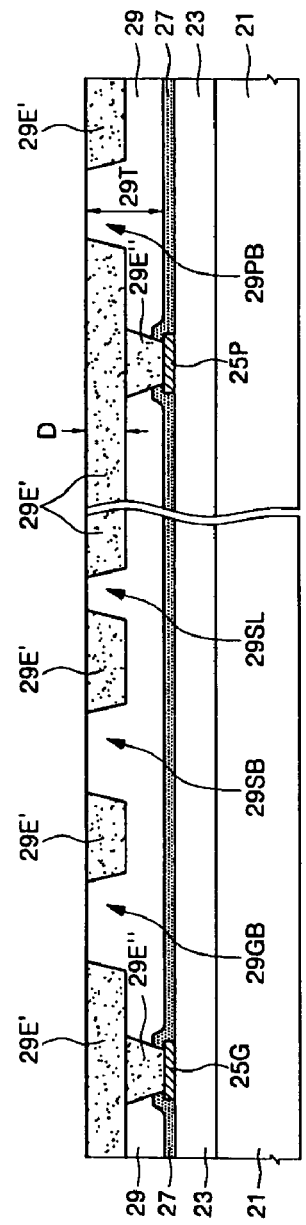

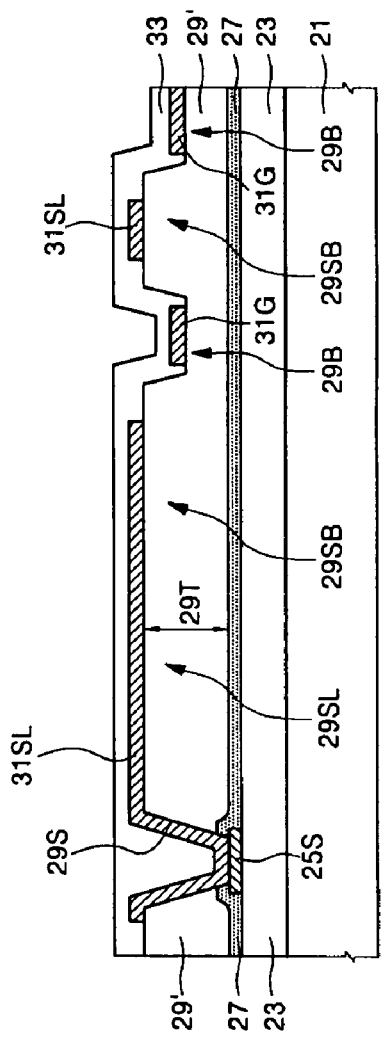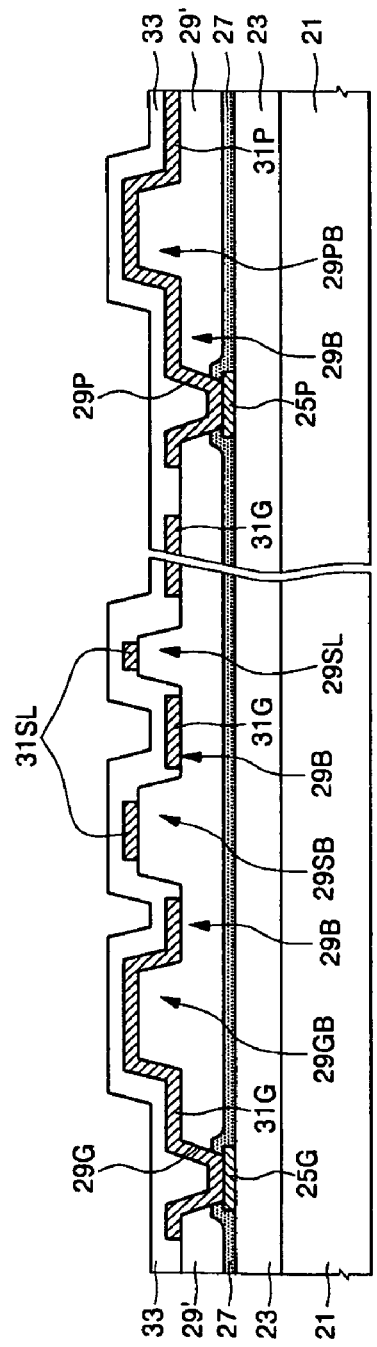
FIG. 8A
FIG. 8B

SEMICONDUCTOR PACKAGE INCLUDING REDISTRIBUTION PATTERN AND METHOD OF MANUFACTURING THE SAME

BACKGROUND OF THE INVENTION

1. Field of the Invention

The present invention generally relates to semiconductor device packages and to methods of fabricating semiconductor device packages, and more particularly, the present invention relates to semiconductor device packages having redistribution patterns and to methods of fabricating semiconductor device packages having redistribution patterns.

2. Description of the Related Art

In semiconductor chip packaging, wafer level packages are known in which external terminals, such as metallic solder balls, are distributed in an array over the surface of a semiconductor chip. In fabrication, the formation of the external terminals is carried out at the wafer level, and thereafter the wafer is diced into separate chip packages. Generally, the pads of the semiconductor chip and the external terminals of the chip package are not aligned, and accordingly, a pad redistribution scheme (or rerouting scheme) is needed in which chip pads are electrically redistributed for connection to the external terminals of the package.

FIG. 1 is a schematic plane view of a pad redistribution scheme employed in a conventional wafer level package, and FIGS. 2A and 2B are cross-sectional views taken along lines I-I' and II-II' of FIG. 1. A single wafer level package is illustrated, but in manufacture a plurality of such packages are simultaneously formed on a wafer and then separated into individual packages.

Referring collectively to FIGS. 1, 2A and 2B, the wafer level package includes a substrate 1 (e.g., a semiconductor chip), an interlayer dielectric layer 3, chip pads 5, a passivation layer 7, and a lower dielectric layer 9. As illustrated, surface portions of the chip pads 5 are exposed through the passivation layer 7 and the lower dielectric layer 9. Conductive redistribution patterns 11 are formed on the lower dielectric layer 9 so as to electrically connect the chip pads 5 to corresponding ones of solder balls 15. The solder balls 15 are formed in openings contained in an upper dielectric layer 13 which covers the redistribution patterns 11 and the lower dielectric layer 9. In this manner, the chip pads 5 are electrically redistributed in the form of the array defined by the solder balls 15.

Although not shown, the redistribution patterns 11 formed on the lower dielectric layer 9 are made up of signal lines, a power line, and a ground line. As such, in view of the intervening dielectric layer 9, parasitic capacitances are formed between these lines and the internal circuitry (not shown) of the chip or substrate 1. These capacitances are inversely proportional to the thickness 9T of the lower dielectric layer 9.

In order to reduce the RC delay time of the signal lines contained in the redistribution pattern, it is desirable to increase the thickness 9T of the lower dielectric layer 9 to thereby minimize the parasitic capacitance between the signal lines and the substrate 1. However, in order to increase noise immunity characteristics, it is desirable to decrease the thickness 9T of the lower dielectric layer to thereby maximize the parasitic capacitance between the power/ground lines and chip 1. Further, increasing the thickness 9T of the lower dielectric layer 9 may disadvantageously increase physical stresses and cause warping of the wafer during manufacture of the package.

SUMMARY OF THE INVENTION

According to an aspect of the present invention, a semiconductor device package is provided which includes a substrate, first and second chip pads spaced apart over a surface of the substrate, and an insulating layer located over the surface of the substrate. The insulating layer includes a stepped upper surface defined by at least a lower surface portion, and an upper surface portion, where a thickness of the insulating layer at the lower surface portion is less than a thickness of the insulating layer at the upper surface portion. The package further includes a conductive reference potential line electrically connected to the first chip pad and substantially located on the lower surface portion of the insulating layer, a conductive signal line electrically connected to the second chip pad and substantially located on the upper surface portion, and first and second external terminals electrically connected to the conductive reference potential line and the conductive signal line, respectively.

According to another aspect of the present invention, a semiconductor device package is provided which includes a substrate, first, second and third chip pads spaced apart over a surface of said substrate, a passivation layer located over the substrate and including first, second and third openings aligned over the first, second and third chip pads, respectively, and an insulating layer located over the passivation layer. The insulating layer includes a stepped upper surface defined by at least (a) a lower surface portion, (b) first, second and third upper terminal support surface portions, and (c) an upper surface portion, where a thickness of the insulating layer at the lower surface portion is less than respective thicknesses of the insulating layer at the upper surface portion and the first, second and third upper terminal support surface portions. The package further includes a power plate electrically connected to the first chip pad, and a ground plate electrically connected to the second chip pad, a conductive signal line electrically connected to the third chip pad and substantially located on the upper surface portion of the insulating layer, and first, second and third external terminal respectively located over the first, second and third upper terminal support surface portions. At least one of the power plate and the ground plate is substantially located on the lower surface portion of the insulating layer, and the first, second and third external terminals are electrically connected to the power plate, the ground plate and the conductive signal line, respectively.

According to still another aspect of the present invention, a semiconductor device package is provided which includes a substrate and an insulating layer located over the surface of the substrate. The insulating layer includes a stepped upper surface defined by at least a lower surface portion and an upper surface portion, where a thickness of the insulating layer at the lower surface portion is less than a thickness of the insulating layer at the upper support surface portion. A conductive reference potential line is substantially located on the lower surface portion of the insulating layer, and a conductive signal line substantially located on the upper surface portion.

According to another aspect of the present invention, a method of manufacturing a semiconductor device package is provided which includes forming an insulating layer over the surface of a substrate, where first and second chip pads are spaced apart over a surface of said substrate, and contouring an upper surface of the insulating layer to obtain a stepped upper surface defined by at least a lower surface portion, and an upper surface portion, where a thickness of the insulating layer at the lower surface portion is less than a thickness of the insulating layer at the upper surface portion. The method further includes forming a conductive reference potential line substantially on the lower surface portion of the insulating layer which is electrically connected to the first chip pad, forming a conductive signal line substantially on the upper surface portion which is electrically connected to the second chip pad, and forming first and second external terminals which are electrically connected to the conductive reference potential line and the conductive signal line, respectively.

Herein, as will become apparent from the detailed description and drawings, the phrase "substantially located on" means that the underlying surface portion of the insulating layer is the principle (but not necessarily exclusive) support surface for the corresponding conductive line or plate.

BRIEF DESCRIPTION OF THE DRAWINGS

The above and other aspects and features of the present invention will become readily apparent from the detailed description that follows, with reference to the accompanying drawings, in which:

FIGS. 5A and 5B through FIGS. 9A and 9B are cross-sectional views for describing a method of manufacturing a semiconductor package according to an embodiment of the present invention, where FIGS. 5A, 6A, 7A, 8A and 9A correspond to the cross-sectional line IV-IV' of FIG. 3, and FIGS. 5B, 6B, 7B, 8B and 9B correspond to the cross-sectional line III-III' of FIG. 3

DETAILED DESCRIPTION OF PREFERRED EMBODIMENTS

The present invention will now be described by way of preferred but non-limiting embodiments of the invention.

Figure 1:
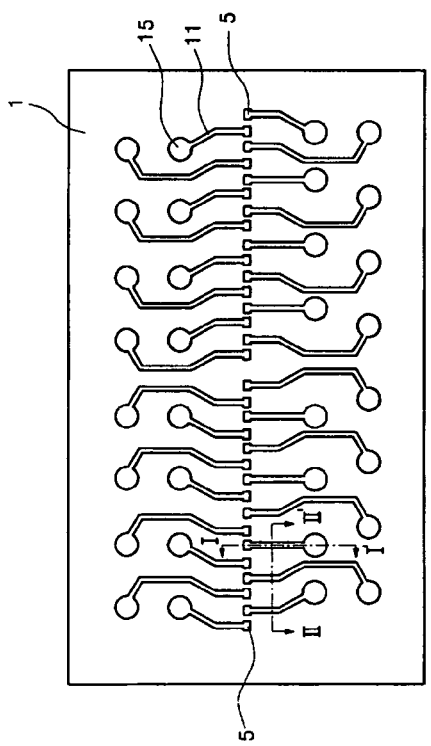
FIG. 1 is a schematic plane view of a pad redistribution scheme employed in a conventional wafer level package.
Figure 2A:
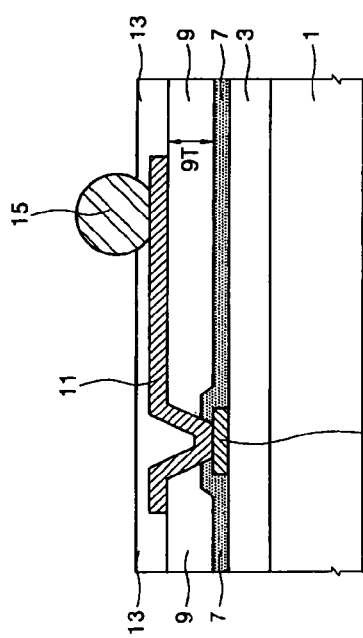
FIGS. 2A and 2B are cross-sectional views taken along lines I-I' and II-II' of FIG. 1, respectively.
Figure 2B:
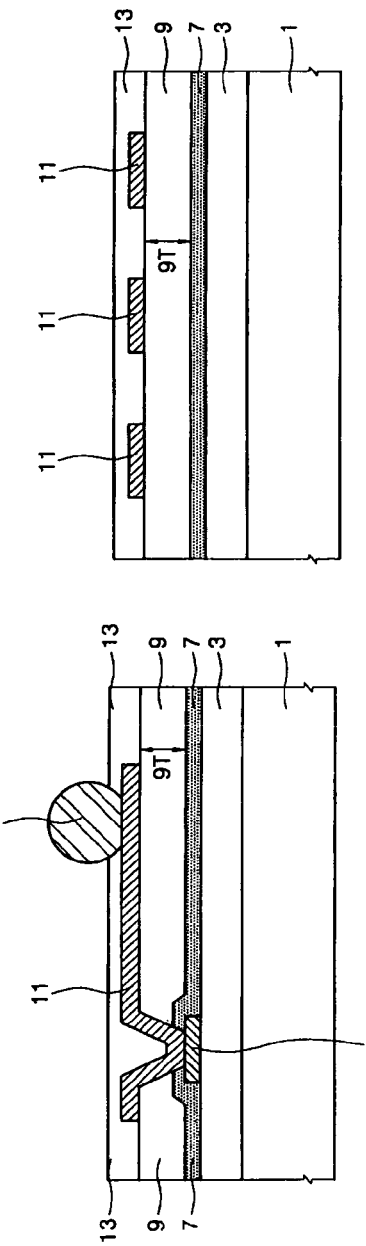
Figure 3:
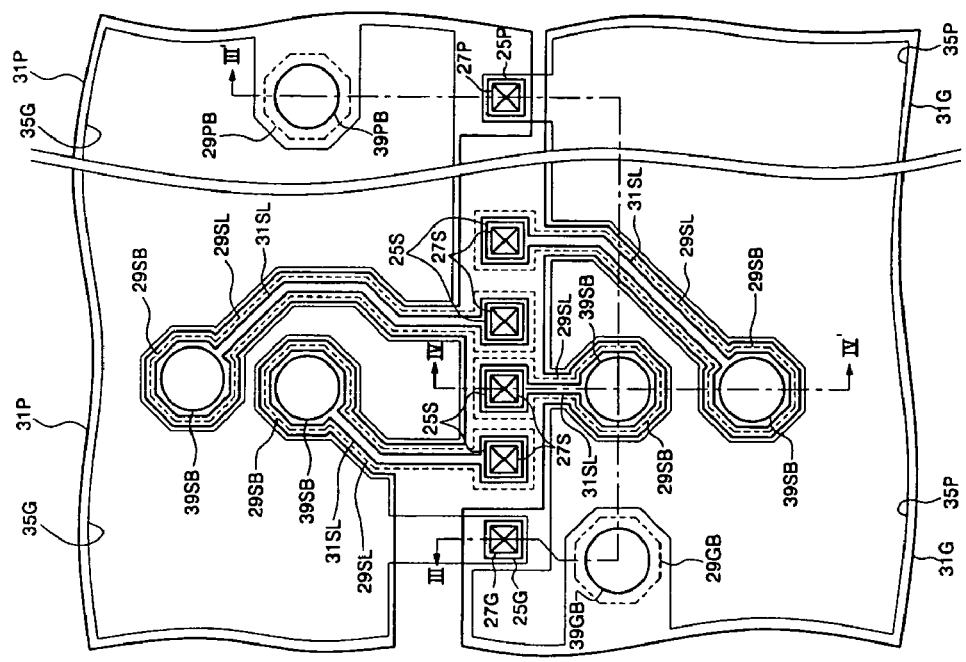
FIG. 3 is a plane view of a semiconductor package according to an embodiment of the present invention.
Figure 4A:
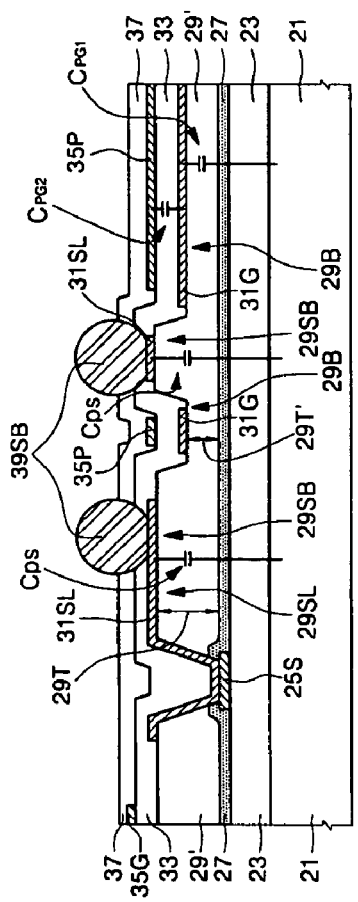
FIGS. 4A and 4B are cross-sectional views taken along lines IV-IV' and III-III' of FIG. 3, respectively.
Figure 4B:
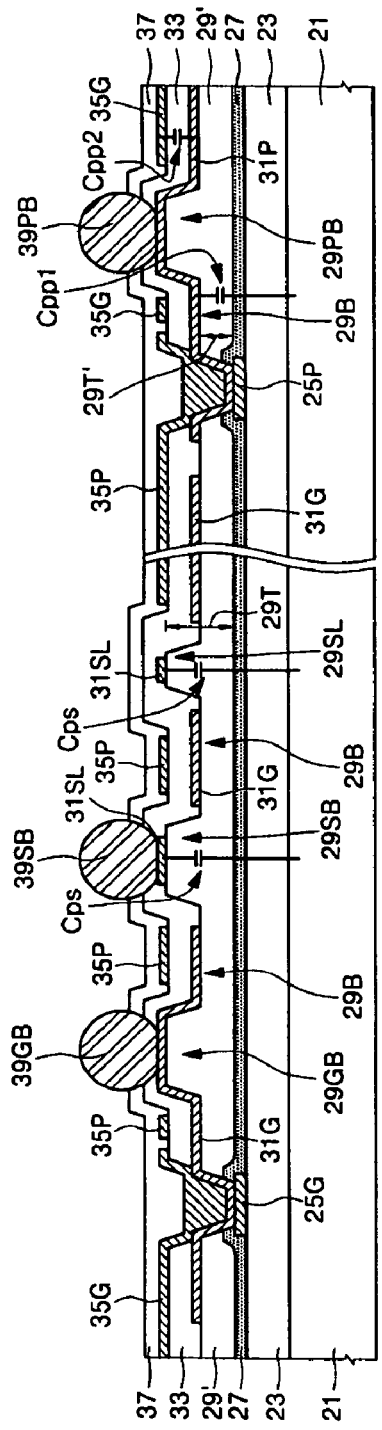

A semiconductor package according to an embodiment of the present invention will now be described in detail with reference to FIGS. 3, 4A and 4B. In these drawings, FIG. 3 is a plane view of the semiconductor package, FIG. 4A is a cross-sectional view along line IV-IV' of FIG. 3, and FIG. 4B is a cross-sectional view along line III-III' of FIG. 3. In the example of this embodiment, the semiconductor package is a wafer level package.

Referring collectively to FIGS. 3, 4A and 4B, the wafer level package of this embodiment includes a semiconductor chip (or substrate) 21 and an interlayer dielectric layer (ILD) 23 formed on the surface of the chip 21. A ground pad 25G, a power pad 25P, and signal pads 25S are distributed over the upper surface of the ILD 23. The ground pad 25G, the power pad 25P, and the signal pads 25S constitute chips pads of the semiconductor package. A passivation layer 27 covers the upper surface of the ILD 23. As shown, the passivation layer 27 includes a ground pad window 27G which exposes an upper surface portion of a ground pad 25G, a power pad window 27P which exposes an upper surface portion of the power pad 25P, and signal pad windows 27S which expose upper surface portions of the signal pads 25S.

Reference number 29' denotes a lower dielectric layer which is formed over the passivation layer 27. The lower dielectric layer 29' is defined by a lower base portion 29B and a plurality of upper protrusion portions. The upper protrusion portions, which have a vertical thickness 29T which is greater than the vertical thickness 29T' of the lower base portion 29B, include a ground ball landing protrusion portion 29GB, a power ball landing protrusion portion 29PB, signal line support protrusion portions 29SL, and signal ball landing protrusion portions 29SB. The lower dielectric layer 29' is further defined by a plurality of openings which are respectively aligned over the ground pad 25G, the power pad 25P, and the signal pads 25S.

As best seen in the plane view of FIG. 3, the signal line support protrusion portions 29SL extend between the signal ball landing protrusion portions 29SB and the respective openings in the lower dielectric layer 29' for the signal pads 25S. In other words, one end of each signal line support protrusion portion 29SL is preferably located immediately adjacent a corresponding opening in the lower dielectric layer 29' for the signal pad 25S, while the opposite end of each signal line support protrusion portion 29SL is preferably located immediately adjacent a corresponding signal ball landing protrusion 29SB.

Conductive signal lines 31SL extend along the signal line support protrusion portions 29SL from the signal pads 25S to the signal ball landing protrusion portion 29SB. As shown, the signal lines 31SL preferably overlap an entirety of the exposed surface portions of the signal pads 25S. A first conductive power plate 31P and a first conductive ground plate 31G are located on the base lower base portion 29B of the lower dielectric layer 29'. In the example of this embodiment, the first power plate 31P and the first ground plate 31G are formed on opposite sides of the device and, collectively, cover substantially an entire surface area of the underlying chip 21.

An upper dielectric layer 33 substantially covers the structure so far described, and includes a plurality of openings which expose solder ball landing regions of the signal lines 31SL, the first ground plate 31G and the first power plate 31P. Positioned within these landing regions are signal solder balls 39SB, ground solder balls 39GB, and power solder balls 39PB, respectively.

Although optional, the example of this embodiment further includes a second ground plate 35G and a second power plate 35P on the surface of the upper dielectric layer 33. Collectively, the second ground plate 35G and the second power plate 35P substantially overlap an entire surface area of the chip 21. Also, as shown, the second ground plate 35G is located over the first power plate 31P, and the second power plate 35P is located over the first ground plate 31G. The second ground plate 35G is electrically coupled to the ground pad 25G through an opening in the upper dielectric layer 33, and the second power plate 35P is electrically coupled to the power plate 25P through another opening in the upper dielectric layer 33. Finally, an additional dielectric layer 37 covers the second ground plate 35G and the second power plate 35P, and includes openings aligned around the solder balls 39GB, 39PB and 39SB.

As shown in FIGS. 4A and 4B, capacitor Cps is representative of the parasitic capacitance between the signal line 31SL and the chip 21, capacitor Cpg1 is representative of the parasitic capacitance between the first ground plate 31G and the chip 21, and capacitor Cpp1 is representative of the parasitic capacitance between the first power plate 31P and the chip 21. As previously described, the thickness 29T of the signal line support protrusion portion 29SL is greater than the thickness 29T' of the vertical thickness 29T' of the lower base portion 29B. As such, the capacitance Cps attributable to the lower dielectric layer 29' is less than the capacitances Cpg1 and Cpp1 also attributable to the lower dielectric layer 29'. The lower capacitance Cps advantageously reduces the RC delay time of the signal lines 31SL, while the higher capacitances Cpg1 and Cpp1 enhance the noise immunity characteristics of the ground plate 31G and the power plate 31P.

Capacitor Cpg2 of FIG. 4A is representative of the parasitic capacitance between the first ground plate 31G and the second power plate 35P, and the capacitor Cpp2 of FIG. 4B is representative of the parasitic capacitance between the first power plate 31P and the second ground plate 35G. Noting that capacitances Cpp1 and Cpp2 are electrically connected in parallel, and that capacitances Cpg1 and Cpg2 are electrically connected in parallel, the noise immunity characteristics of the device are further improved by the presence of the second ground plate 35G and the second power plate 35P. Further, since the thickness of a large majority of the dielectric layer 29' is relatively small, the introduction of stresses and warping of the wafer are avoided during manufacture.

As one skilled in the art will appreciate, the embodiment of FIGS. 3, 4A and 4B may be modified in a number of different respects. For example, as already suggested, the second ground plate 35G and/or the second power plate 35P may be omitted, in which case the additional dielectric layer 37 may be omitted. As another example, the second ground plate 35G and/or the second power plate 35P may be located between the passivation layer 27 and the lower dielectric layer 29'.

An exemplary embodiment of manufacturing the device of FIGS. 3, 4A and 4B will now be described with reference to FIGS. 5A and 5B through FIGS. 9A and 9B. FIGS. 5A, 6A, 7A, 8A and 9A correspond to the cross-sectional line IV-IV' of FIG. 3, and FIGS. 5B, 6B, 7B, 8B and 9B correspond to the cross-sectional line III-III' of FIG. 3.

Referring first to FIGS. 5A and 5B, reference number 21 denotes a substrate containing internal circuitry (not shown). The substrate 21, for example, may be one of a plurality of semiconductor chips contained in a wafer. As shown in the figures, the substrate 21 is covered with an interlayer dielectric layer (ILD) 23, and chip pads 25S (signal pad), 25G (ground pad) and 25P (power pad) are formed on the upper surface of the ILD 23. Although not shown, the chip pads 25S, 25G and 25P are connected to the internal circuitry of the substrate 21. A passivation layer 27 is formed over the resultant structure and then patterned to define pad windows 27S, 27G and 27P which expose upper surface portions of the respective chip pads 25S, 25G and 25P. The passivation layer 27 may, for example, be formed as a composite layer of a silicon oxide layer and a silicon nitride layer.

Turning to FIGS. 6A and 6B, a lower dielectric layer 29 having a thickness 29T is formed over the passivation layer 27. In the example of this embodiment, the lower dielectric layer 29 is formed of a polymer material containing a photo active compound. Examples of the polymer material include benzo-cylco-butens (BCB), poly-benzo-oxazol (PBO), polymide, and expoxy. An example of the photo active compound is diazo naphta quinine (DNQ). The lower dielectric layer is then subjected to two photo exposure processes. In one photo exposure process, a mask (not shown) is formed so as to cover the ground ball landing protrusion portion 29GB, the power ball landing protrusion portion 29PB, the signal line support protrusion portions 29SL, and the signal ball landing protrusion portions 29SB. The resultant structure is then exposed to photo energy sufficient to define exposed regions 29E' to a depth D within the lower dielectric layer 29. In the other photo exposure process, another mask (not shown) is formed on the upper surface of the lower dielectric layer 29 with openings aligned over the chip pads 25S, 25G and 25P. The resultant structure is then exposed to photo energy sufficient to define exposed regions 29E" to a depth 29T (>D) within the lower dielectric layer 29. It is noted that the respective masks are removed after each photo process.

Figure 7A:
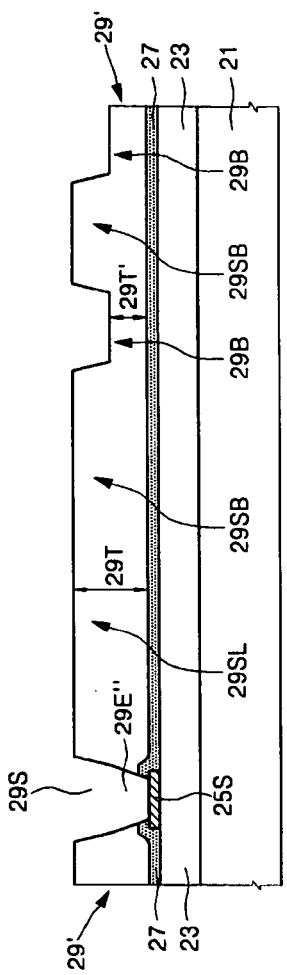
Figure 7B:
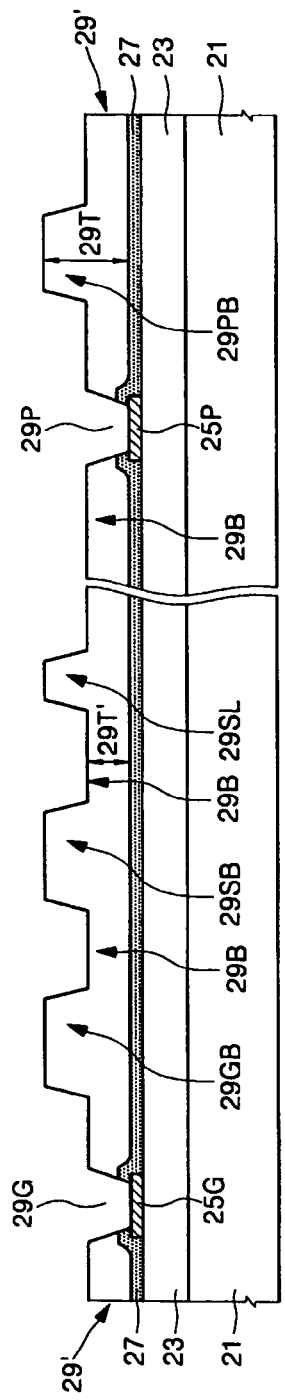

Referring to FIGS. 7A and 7B, the exposed regions 29E' and 29E" are removed by a chemical developer solution. As such, openings 29S, 29G and 29P are defined within the lower dielectric layer 29' which expose the signal pads 25S, the ground pad 25G and the power pad 25P, respectively. Further, the lower base portion 29B, the ground ball landing protrusion portion 29GB, the power ball landing protrusion portion 29PB, the signal line support protrusion portions 29SL, and the signal ball landing protrusion portions 29SB are all formed. As shown, the lower base portion 29B has a thickness 29T', whereas the ground ball landing protrusion portion 29GB, the power ball landing protrusion portion 29PB, the signal line support protrusion portions 29SL, and the signal ball landing protrusion portions 29SB all have a thickness 29T.

Referring now to FIGS. 8A and 8B, the previous structure (FIGS. 7A and 7B) is covered with a metal conductive layer which is then patterned to form the signal lines 31SL, the ground plate 31G and the power plate 31P. The upper dielectric layer 33 is then deposited over the resultant structure. The upper dielectric layer 33 may, for example, be formed of a polymer. As another example, the upper dielectric layer 33 may be a conformal layer of silicon dioxide deposited by plasma chemical vapor deposition.

Figure 9A:
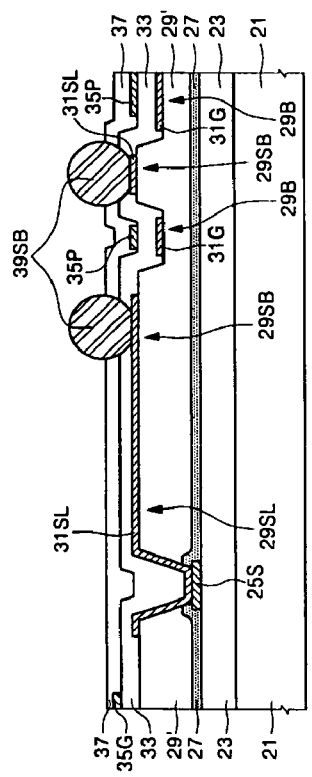
Figure 9B:
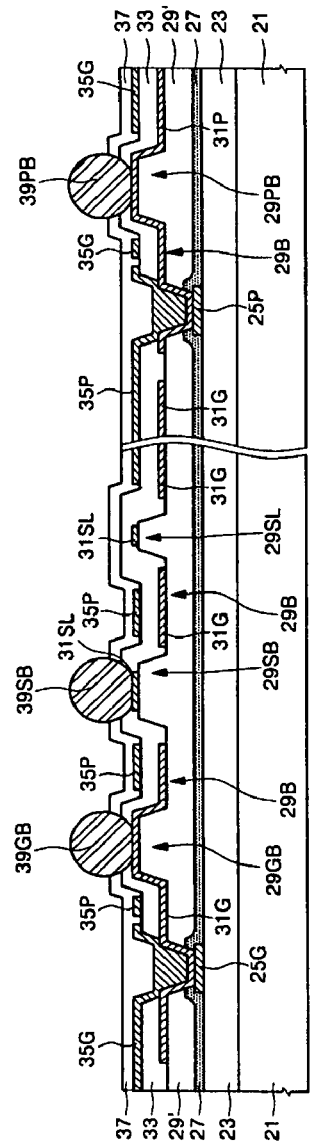

Referring to FIGS. 9A and 9B, the upper dielectric layer 33 is patterned to expose solder ball landing regions of the signal lines 31SL, the ground plate 31G and the power plate 31P. Solder balls 39SB, 39GB and 39PB are then placed in the respective landing regions of the signal lines 31SL, the ground plate 31G and the power plate 31P.

At this stage, in the case where the optional second ground plate 35G and second power plate 35P are to be omitted, and the substrate 21 is one of a plurality of chips of a semiconductor wafer, the wafer is separated (e.g., diced) into a plurality of wafer level packages.

In the case where one or both of the plates 35G and 35P is to be included, then an additional plate layer is formed on the upper dielectric layer 33 prior to formation of the solder balls 39SB, 39GB and 39PB. The additional plate layer is patterned to define the second ground plate 35G and/or the second power plate 35P. Another dielectric layer 37 is formed over the resultant structure and then patterned to define openings in which the solder balls 39SB, 39GB and 39PB are formed. The dielectric layer 37 may optionally be formed of a same material as the upper dielectric layer 33.

After formation of the solder balls 39SB, 39GB and 39PB, and in the case where the substrate 21 is one of a plurality of chips of a semiconductor wafer, the wafer is separated (e.g., diced) into a plurality of wafer level packages.

In the method described above, the patterned protrusion portions of the lower dielectric layer 29' are formed by conducting two masked photo exposure processes (FIGS. 6A and 6B) followed by chemical development removal (FIGS. 7A and 7B). An alternative method of forming these protrusion portions of the lower dielectric layer 29' will now be described with reference to FIGS. 10 and 11.

Figure 10:
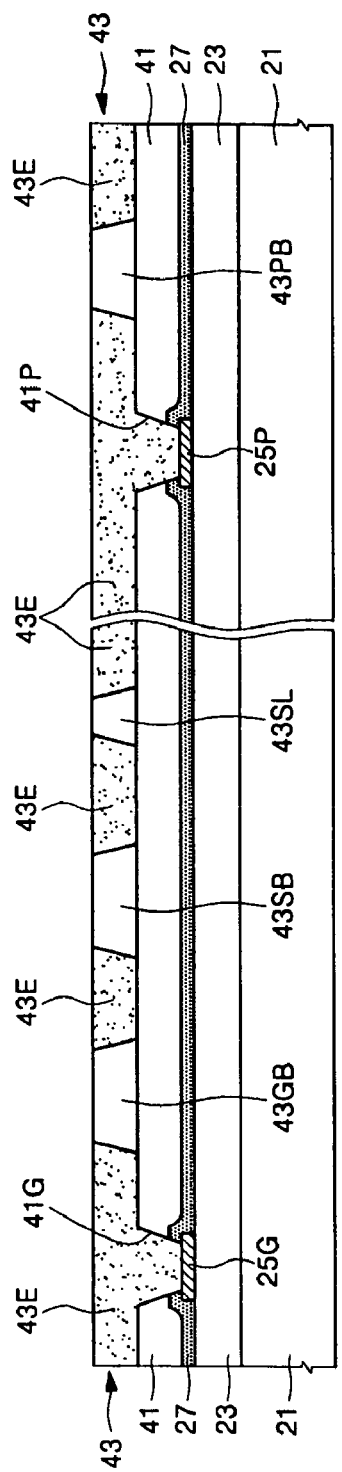
FIGS. 10 and 11 are cross-sectional views for describing a method of forming protrusion portions of a dielectric layer according to an embodiment of the present invention.

Referring to FIG. 10, a structure such as that shown in FIG. 5B is covered with a first lower dielectric layer 41. That is, the first lower dielectric 41 layer is formed over a passivation layer 27 and chip pads 25G and 25P, which in turn are formed over an ILD 23 located on a substrate or chip 21. The first lower dielectric layer 41 is patterned to form via holes 41G and 41P which expose upper surface portions of the ground pad 25G and power pad 25P. Although not shown in the cross-sectional view of FIG. 10, via holes are also formed to expose upper surface portions of signal pads located on the ILD 23. Patterning of the dielectric layer may be by photolithography. The patterned dielectric layer 41 is hardened by thermal treatment, and then a second lower dielectric layer 43 is deposited on the resultant structure. The second lower dielectric layer 43 is then subjected to a photo exposure process in which a mask (not shown) is formed so as to cover a ground ball landing protrusion portion 43GB, a power ball landing protrusion portion 43PB, signal line support protrusion portions 43SL, and signal ball landing protrusion portions 43SB. The resultant structure is then exposed to photo energy sufficient to define exposed regions 43E within the second lower dielectric layer 43.

Figure 11:
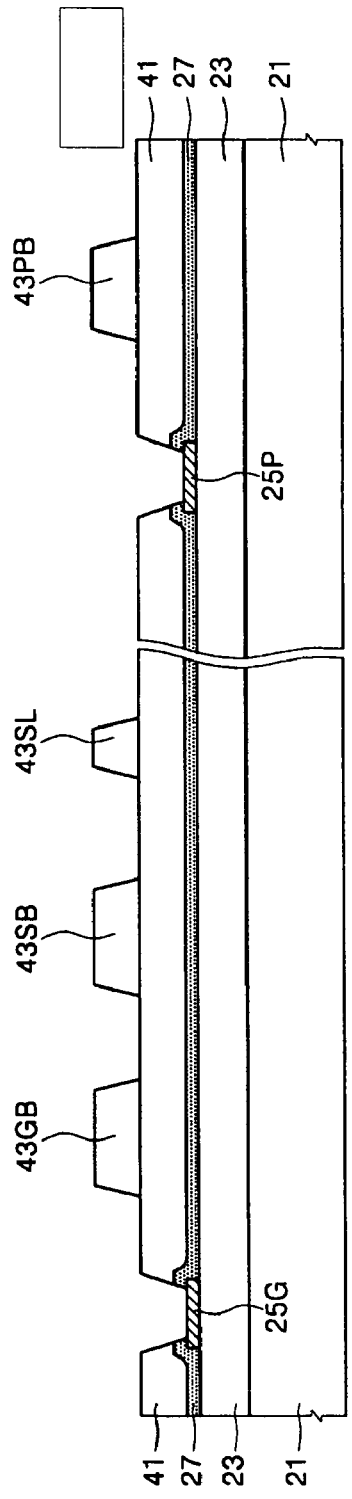

Referring to FIG. 11, the exposed regions 43E are removed by a chemical developer solution. As such, as structure having a surface contour similar to that illustrated in previously described FIG. 7B is obtained.

Another alternative method for obtaining the patterned protrusion portions of the lower dielectric layer will now be described with reference to FIGS. 12 and 13.

Figure 12:
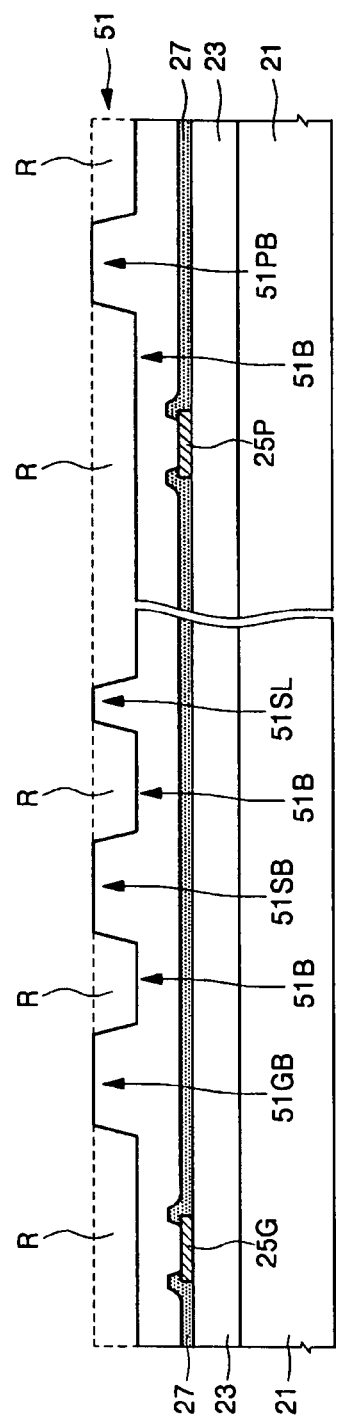
FIGS. 12 and 13 are cross-sectional views for describing a method of forming protrusion portions of a dielectric layer according to an embodiment of the present invention.

Referring to FIG. 12, a structure such as that shown in FIG. 5B is covered with a lower dielectric layer 51. That is, the lower dielectric layer 51 is formed over a passivation layer 27 and chip pads 25G and 25P, which in turn are formed over an ILD 23 located on a substrate or chip 21. The lower dielectric layer 51 may, for example, be formed of an inorganic insulating material (e.g. silicon oxide) that is deposited by plasma chemical vapor deposition or atomic layer deposition. As another example, the lower dielectric layer 51 may be formed of a polymer which is devoid of a photo active compound. After deposition of the lower dielectric layer 51, a photoresist mask (not shown) is formed thereon so as to cover a ground ball landing protrusion portion 51GB, a power ball landing protrusion portion 51PB, signal line support protrusion portions 51SL, and signal ball landing protrusion portions 51SB. The resultant is then subjected to an etching process to partially remove regions of the lower dielectric layer 51 identified by reference character R in FIG. 12.

Figure 13:
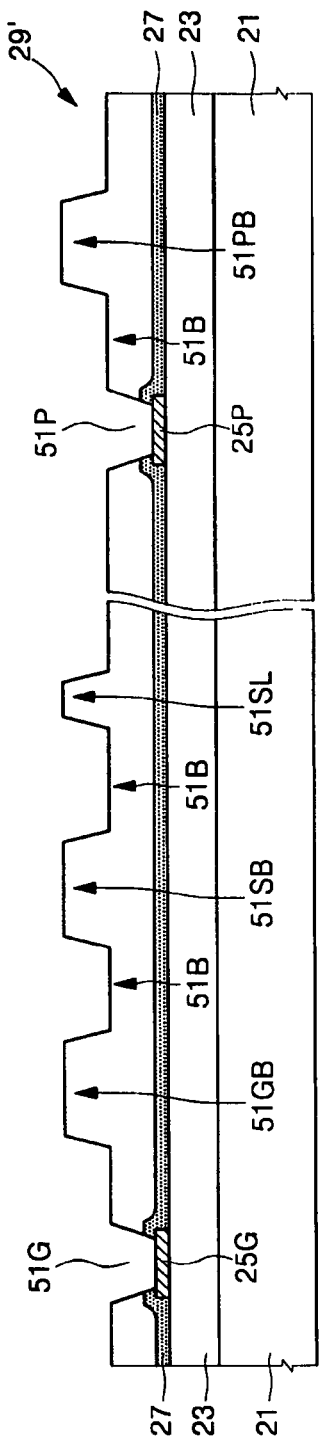

Referring to FIG. 13, another photoresist mask (not shown) is patterned and another etching process is carried out so as to define via holes 51G and 51P in the lower dielectric layer 51. As shown, via holes 51G and 51P expose respective surface portions of the ground pad 25G and the power pad 25P. As such, the photoresist mask is removed and a structure having a surface contour similar to that illustrated in previously described FIG. 7B is obtained.

Figure 14:
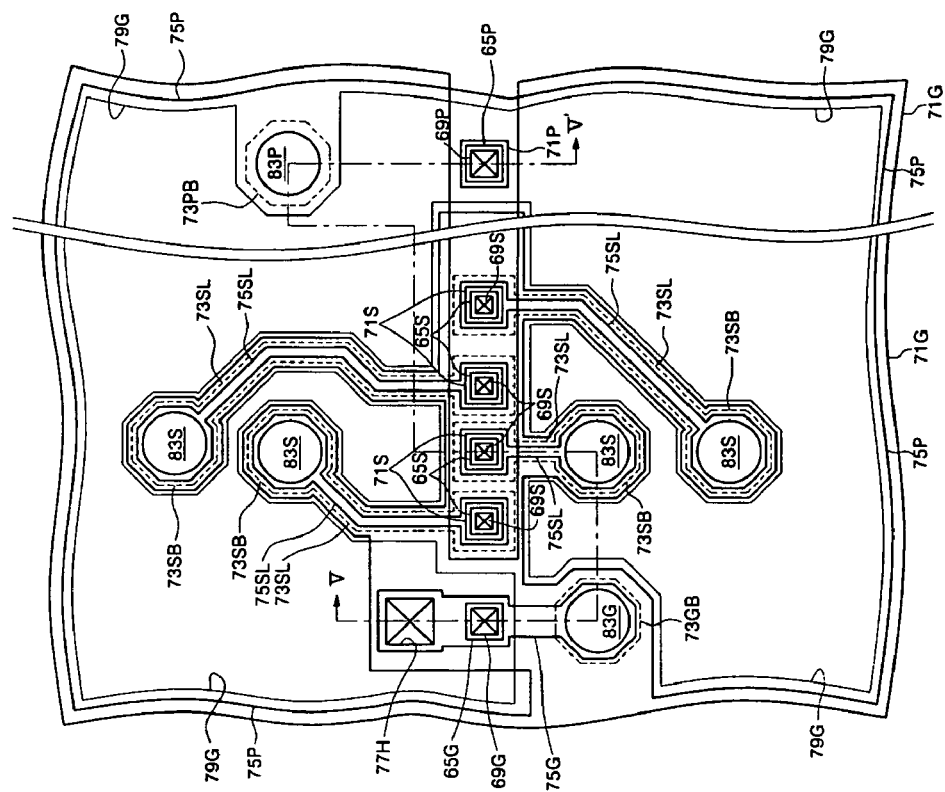
FIG. 14 is a plane view of a semiconductor package according to another embodiment of the present invention.
Figure 15:
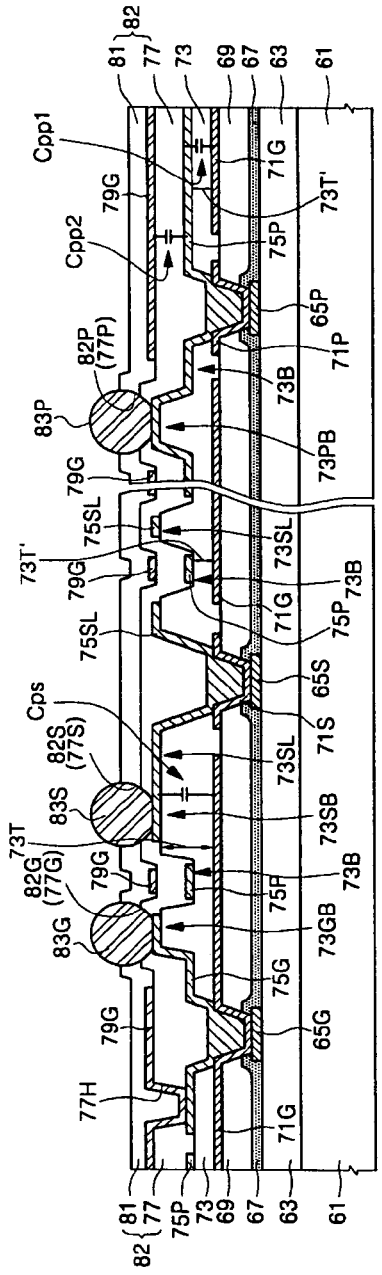
FIG. 15 is a cross-sectional views taken along line V-V' of FIG. 14.

Another embodiment of the present invention will now be described with reference to FIGS. 14 and 15. FIG. 14 is a plan view of the device of the present embodiment, and FIG. 15 is a cross-sectional view taken along line V-V' of FIG. 14. The device of this embodiment may be a wafer level package.

Referring collectively to FIGS. 14 and 15, the wafer level package of this embodiment includes a semiconductor chip (or substrate) 61 and an interlayer dielectric layer (ILD) 63 formed on the surface of the chip 61. A ground pad 65G, a power pad 65P, and signal pads 65S are distributed over the upper surface of the ILD 63. The ground pad 65G, the power pad 65P, and the signal pads 65S constitute chips pads of the semiconductor package. A passivation layer 67 covers the upper surface of the ILD 63. As shown, the passivation layer 67 includes a plurality of windows which expose upper surface portions of the ground pad 65G, the power pad 65P, and the signal pads 65S.

Reference number 69 denotes a lower dielectric layer which is formed over the passivation layer 67, and which includes a plurality of openings which expose the upper surface portions of the ground pad 65G, the power pad 65P, and the signal pads 65S.

A ground plate 71G substantially overlaps an entirety of the chip 61, except for openings aligned over the signal pad 65S and the power pad 65P. Note that the ground plate 71G contacts the ground pad 65G as shown.

Also formed on the lower dielectric layer 69 are additional signal and power pads 71S and 71P which contact the signal pads 65S and power pad 65P, respectively, as shown.

The middle dielectric layer 73 is formed over the ground plate 71G, and is defined by a lower base portion 73B and a plurality of upper protrusion portions. The upper protrusion portions, which have a vertical thickness 73T which is greater than the vertical thickness 73T' of the lower base portion 73B, include a ground ball landing protrusion portion 73GB, a power ball landing protrusion portion 73PB, signal line support protrusion portions 73SL, and signal ball landing protrusion portions 73SB. The middle dielectric layer 73 is further defined by a plurality of openings which are respectively aligned over the ground pad 65G, the power pad 65P, and the signal pads 65S.

The signal line support protrusion portions 73SL extend between the signal ball landing protrusion portions 73SB and the respective openings in the lower dielectric layer 73 for the signal pads 65S. In other words, one end of each signal line support protrusion portion 73SL is preferably located immediately adjacent a corresponding opening in the lower dielectric layer 73 for the signal pad 65S, while the opposite end of each signal line support protrusion portion 73SL is preferably located immediately adjacent a corresponding signal ball landing protrusion 73SB.

Conductive signal lines 75SL extend along the signal line support protrusion portions 73SL from the conductive line 71S overlapping the signal pads 65S to the signal ball landing protrusion portion 73SB. As shown, the signal lines 75SL preferably overlap an entirety of the of the signal pads 65S. Also, a ground line 75G extends from the conductive line 71G overlapping the ground pad 65G to the ground ball landing protrusion portion 73GB. Again, the ground line 75G preferably overlaps an entirety of the ground pad 65G.

A conductive power plate 75P is located on the base lower base portion 73B of the middle dielectric layer 73, and overlaps substantially an entire surface area of the underlying chip 61, except for the signal line support protrusion portions 73SL, the signal ball landing protrusion portions 73SB, and the ground line 75G.

As is further illustrated in FIG. 15, an upper dielectric layer 77 is formed over above-described structure, and another ground plate 79G is formed thereon. The ground plate 79G substantially overlaps an entirety of the surface of the underlying chip 61, except for the signal line support protrusion portions 73SL, the signal ball landing protrusion portions 73SB, the ground ball landing portion 73GB, and the power ball landing portion 73PB. Also, as shown, the ground plate 79G contacts the conductive line 75G via a conductive layer contained in an opening 77H in the upper dielectric layer 77. Further, the upper dielectric layer 77 includes a plurality of openings 77S, 77G and 77P which expose solder ball landing regions of the signal lines 75SL, the ground plate 75G and the power plate 75P.

This structure is substantially covered by another dielectric layer 81 which includes a plurality of openings which expose the solder ball landing regions of the signal lines 75SL, the ground plate 75G and the power plate 75P. Positioned within these landing regions are signal solder balls 83S, ground solder balls 83G, and power solder ball 83P, respectively.

As with the initial embodiment of the invention, the embodiment of FIGS. 14 and 15 allow for an improvement in the RC delay time of the signal lines by controlling the relative thicknesses 73T and 73T'. That is, a relative large thickness 73T decreases the parasitic capacitance Cps of the device, thus reducing the RC delay time, a relative small thickness 73T' increases the parasitic capacitance Cpp1, thus increasing noise immunity characteristics. Also, the presence of the parasitic capacitance Cpp2 further improves noise immunity characteristics.

An alternative to the embodiment of FIGS. 14 and 15 is to omit the second ground plate 79G. In this case, as single upper dielectric layer 82 is located over the power plate 75P, having openings 82G, 82S and 82P for exposure of the ball landings for the solder balls 83G, 83S and 83P, respectively.

Another alternative to the embodiment of FIGS. 14 and 15 is change the power plate 75P to a ground plate, and to change the ground plates 71G and 79G to power plates. In this case, reference numbers 65G, 71G, 75G, 79G and 83G would denote power potential elements, and reference numbers 65P, 71P, 75P and 83P would denote ground potential elements.

Figure 16:
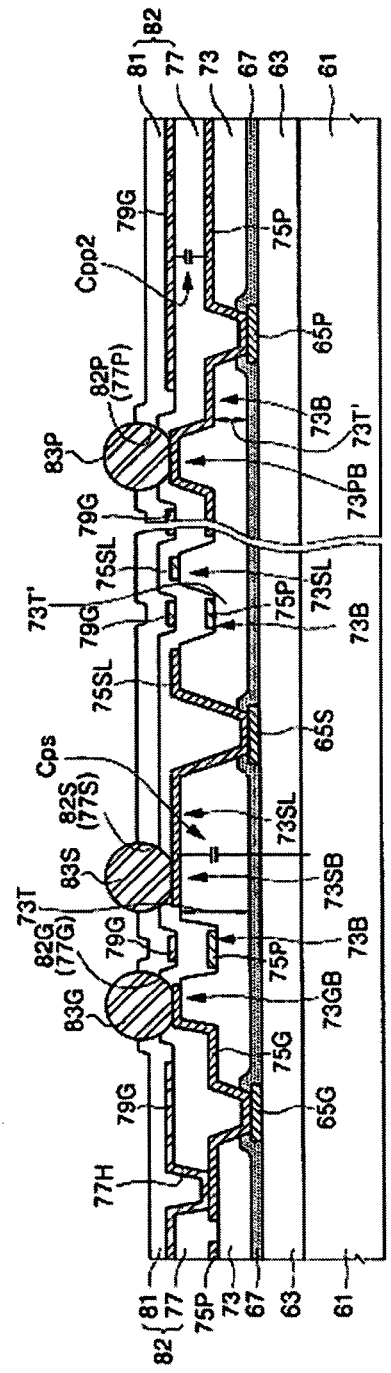
FIG. 16 is a cross-sectional view of a semiconductor package according to yet another embodiment of the present invention.

Yet another alternative embodiment is illustrated in FIG. 16. This embodiment is the same as that illustrated in FIG. 15, except that the lower insulating layer 69, the lower ground plate 71G, the additional power pad 71P, and the additional signal pads 71S have been omitted. The remaining corresponding components of the device are illustrated with the same reference numbers used in FIG. 15, and accordingly, a detailed description thereof is omitted here to avoid redundancy.

In addition, the embodiment of FIG. 16 may be modified by utilizing the ground plate 79G as a power plate, and the power plate 75P as a ground plate. In this case, reference numbers 65G, 75G, 79G and 83G would denote power potential elements, and reference numbers 65P, 75P and 83P would denote ground potential elements.

A method of fabricating the embodiments of FIGS. 14, 15 and 16 may be similar to that described previously in connection with the initial embodiment of the invention. That is, the fabrication method may generally including alternating steps of depositing/patterning dielectric and conductive layers. The protrusion portions of the dielectric layer 73 may be obtained using any of the methods previously described.

In the various examples of the present invention described above, the semiconductor package is a wafer level semiconductor package. However, the invention is not so limited. For example, redistribution techniques of the invention may also be used in so-called flip-chip bonding package structures in which a semiconductor chip is attached to a carrier substrate through a two-dimensional array of conductive bumps, such that an active surface of the chip faces down on the carrier substrate. The chip may include the redistribution techniques of the present invention to electrically align the chip pads with the conductive bumps of the carrier substrate. As another example, the redistribution techniques may be applied to the type of package described in U.S. Patent Application Pub. No. 2003/0011068, i.e., to a semiconductor package which includes a plurality of stacked chips.

Likewise, the invention is not limited to the use of solder balls and/or solder bumps as the external electrodes. For example, the external terminals may instead be bonding wires.

As such, although the present invention has been described above in connection with the preferred embodiments thereof, the present invention is not so limited. Rather, various changes to and modifications of the preferred embodiments will become readily apparent to those of ordinary skill in the art. Accordingly, the present invention is not limited to the preferred embodiments described above. Rather, the true spirit and scope of the invention is defined by the accompanying claims.

What is claimed is:

1. A semiconductor device package, comprising:
   a substrate;
   first and second chip pads spaced apart over a surface of said substrate;
   an insulating layer located over the surface of the substrate, said insulating layer comprising a stepped upper surface defined by at least a lower surface portion, and an upper surface portion, wherein a thickness of the insulating layer at the lower surface portion is less than a thickness of the insulating layer at the upper support surface portion;
   a conductive reference potential line electrically connected to the first chip pad and substantially located on the lower surface portion of the insulating layer;
   a conductive signal line electrically connected to the second chip pad and substantially located on the upper surface portion; and
   first and second external terminals electrically connected to the conductive reference potential line and the conductive signal line, respectively.

2. The semiconductor device package of claim 1, wherein the conductive reference potential line is one of a ground plate and a power plate.

3. The semiconductor device package of claim 2, wherein the one of a ground plate and a power plate substantially overlaps an entire surface region of the substrate.

4. The semiconductor device package of claim 1, wherein the conductive reference potential line is a ground plate, and wherein the package further comprises a third chip pad and a power plate, wherein the power plate is electrically connected to the third chip pad and substantially located on the lower surface portion of the insulating layer.

5. The semiconductor device package of claim 4, wherein the ground plate and the power plate are substantially co-planar, and wherein the conductive signal line is located above the plane of the ground and power plates relative to the substrate.

6. The semiconductor device package of claim 5, wherein the ground plate and the power plate substantially overlap respectively opposite sides of an upper surface of the substrate.

7. The semiconductor device package of claim 1, wherein the insulating layer is a first insulating layer, and wherein the package further comprises a second insulating layer located over the first insulating layer, the conductive reference potential line and the conductive signal line, and wherein the first and second external terminals electrically contact the conductive reference potential line and the conductive signal line through the second insulating layer.

8. The semiconductor device package of clam 7, wherein the conductive reference potential line is one of a ground plate and a power plate, and wherein the package further comprises another one of a ground plate and a power plate located over the second insulating layer.

9. The semiconductor device package of claim 8, wherein the ground plate or the power plate each substantially overlap an entire surface region of the substrate.

10. The semiconductor device package of claim 8, further comprising a third insulating layer located over the second insulating layer and the other one of the ground plate and the power plate.

11. The semiconductor device package of claim 8, wherein the conductive reference potential line is a first ground plate, and wherein the package further comprises a third chip pad and a power plate, wherein the power plate is electrically connected to the third chip pad and located on the lower surface portion of the first insulating layer.

12. The semiconductor device package of claim 11, wherein the power plate is a first power plate, and wherein the package further comprises a second ground plate and a second power plate located over the second insulating layer, wherein the first and second ground plates are electrically connected through the second insulating layer, and wherein the first and second power plates are electrically connected through the second insulating layer.

13. The semiconductor device package of claim 12, wherein the first ground plate and the first power plate substantially overlap respectively opposite sides of an upper surface of the substrate, wherein the second ground plate substantially overlaps the first power plate, and wherein the second power plate substantially overlaps the first ground plate.

14. The semiconductor device package of claim 1, further comprising an interlayer dielectric layer and a passivation layer located between the substrate and the insulating layer.

15. The semiconductor device package of claim 14, further comprising another insulating layer and at least one of a ground plate and a power plate located on the insulating layer.

16. The semiconductor device package of claim 1, wherein the semiconductor package is a wafer level package.

17. The semiconductor device package of claim 1, wherein the first and second external terminals are solder ball structures.

18. The semiconductor device package of claim 1, wherein the first and second external terminals are solder bump structures.

19. The semiconductor device package of claim 1, wherein the first and second external terminals are bonding wires.

20. A semiconductor device package, comprising:
a substrate;
an insulating layer located over the surface of the substrate, said insulating layer comprising a stepped upper surface defined by at least a lower surface portion, and an upper surface portion, wherein a thickness of the insulating layer at the lower surface portion is less than a thickness of the insulating layer at the upper support surface portion;
a conductive reference potential line substantially located on the lower surface portion of the insulating layer; and
a conductive signal line substantially located on the upper surface portion.

21. The semiconductor device package of claim 20, wherein the conductive reference potential line is one of a ground plate and a power plate.

22. The semiconductor device package of claim 21, wherein the conductive reference potential line is a ground plate, and wherein the package further comprises a power plate that is substantially located on the lower surface portion of the insulating layer.

23. The semiconductor device package of claim 22, wherein the ground plate and the power plate are substantially co-planar, and wherein the conductive signal line is located above the plane of the ground and power plates relative to the substrate.

24. The semiconductor device package of claim 23, wherein the ground plate and the power plate substantially overlap respectively opposite sides of an upper surface of the substrate.

25. The semiconductor device package of claim 20, wherein the insulating layer is a first insulating layer, and wherein the package further comprises a second insulating layer located over the first insulating layer, the conductive reference potential line and the conductive signal line.

26. The semiconductor device package of claim 25, wherein the conductive reference potential line is one of a ground plate and a power plate, and wherein the package further comprises another one of a ground plate and a power plate located over the second insulating layer.

27. The semiconductor device package of claim 26, wherein the power plate and the ground plate each substantially overlap an entire surface region of the substrate.

28. The semiconductor device package of claim 20, wherein the semiconductor package is a wafer level package.

29. A method of manufacturing a semiconductor device package, comprising:
forming an insulating layer over the surface of a substrate, wherein first and second chip pads are spaced apart over a surface of said substrate;
contouring an upper surface of the insulating layer to obtain a stepped upper surface defined by at least a lower surface portion and an upper surface portion, wherein a thickness of the insulating layer at the lower surface portion is less than a thickness of the insulating layer at the upper surface portion;
forming a conductive reference potential line on the lower surface portion of the insulating layer which is electrically connected to the first chip pad;
forming a conductive signal line on the upper surface portion which is electrically connected to the second chip pad; and
forming first and second external terminals which are electrically connected to the conductive reference potential line and the conductive signal line, respectively.

30. The method of claim 29, wherein the conductive reference potential line is formed as one of a ground plate and a power plate.

31. The method of claim 30, wherein the insulating layer is a first insulating layer, and wherein the method further comprises:
forming a second insulating layer located over the first insulating layer, the conductive reference potential line, and the conductive signal line; and
electrically contacting the first and second external terminals with the conductive reference potential line and the conductive signal line, respectively, through the second insulating layer.

32. The method of claim 31, wherein the conductive reference potential line is one of a ground plate and a power plate, and wherein the method further comprises forming another one of a ground plate and a power plate over the second insulating layer.

33. The method of claim 32, further comprising forming a third insulating layer over the second insulating layer and the another one of the ground plate and the power plate.

34. The method of claim 30, wherein the insulating layer is formed as a single layer of insulating material.

35. The method of claim 30, wherein the insulating layer is formed as multiple layers of insulating material.

36. The method of claim 30, wherein the upper surface of the insulating layer is contoured by subjecting the insulating layer to at least one masked photolithography process.

37. The method of claim 36, wherein the at least one masked photolithography process comprises:
a first photo exposure process comprising forming a first mask pattern over the insulating layer, exposing the insulating layer to a first depth through openings in the first mask pattern, and removing the mask pattern;
a second photo exposure process comprising forming a second mask pattern over the insulating layer, exposing the insulating layer to a second depth which is less than first depth through openings in the second mask pattern, and removing the second mask pattern; and
using a developer solution to remove portions of the insulating layer exposed in the first and second photo exposure processes.

38. The method of claim 36, wherein the insulating layer is formed of a first insulating layer and a second insulating layer, and wherein the at least one masked photolithography process comprises:
patterning the first insulating layer prior to forming the second insulating layer so as to expose the first and second chip pads through the first insulating layer;
forming the second insulating layer over the patterned first insulating layer;
forming a mask pattern over the second insulating layer, exposing the second insulating layer through openings in the second mask pattern, and removing the mask pattern; and
using a developer solution to remove exposed portions of the second insulating layer.

39. The method of claim 38, wherein the first insulating layer is patterned by photolithography, and wherein the method further comprises subjecting the patterned first insulating layer to heat treatment prior to exposure of the second insulating layer.

40. The method of claim 30, wherein the upper surface of the insulating layer is contoured by subjecting the insulating layer to at least one masked etching process.

41. The method of claim 40, wherein the at least one masked etching process comprises:
a etching process comprising forming a first mask pattern over the insulating layer, etching the insulating layer to a first depth through openings in the first mask pattern, and removing the first mask pattern; and
a etching process comprising forming a second mask pattern over the insulating layer, etching the insulating layer to a second depth which is less than first depth through openings in the second mask pattern, and removing the second mask pattern.

* * * * *